United States Patent
Heston

(10) Patent No.: US 7,253,517 B2
(45) Date of Patent: Aug. 7, 2007

(54) METHOD AND APPARATUS FOR COMBINING MULTIPLE INTEGRATED CIRCUITS

(75) Inventor: John G. Heston, Murphy, TX (US)

(73) Assignee: Raytheon Company, Waltham, MA (US)

( * ) Notice: Subject to any disclaimer, the term of this patent is extended or adjusted under 35 U.S.C. 154(b) by 154 days.

(21) Appl. No.: 10/694,873

(22) Filed: Oct. 28, 2003

(65) Prior Publication Data

US 2005/0087438 A1  Apr. 28, 2005

(51) Int. Cl.
H01L 23/34 (2006.01)
H01L 23/02 (2006.01)

(52) U.S. Cl. .................. 257/728; 257/686; 438/109; 29/739

(58) Field of Classification Search ............. 257/685, 257/728

See application file for complete search history.

(56) References Cited

U.S. PATENT DOCUMENTS

| | | | | |
|---|---|---|---|---|
| 4,693,770 | A * | 9/1987 | Hatada | 156/151 |
| 5,869,894 | A * | 2/1999 | Degani et al. | 257/723 |
| 5,975,408 | A * | 11/1999 | Goossen | 228/173.2 |
| 6,100,593 | A * | 8/2000 | Yu et al. | 257/777 |
| 6,576,998 | B1 * | 6/2003 | Hoffman | 257/724 |
| 6,621,155 | B1 * | 9/2003 | Perino et al. | 257/686 |
| 6,756,663 | B2 * | 6/2004 | Shiraishi et al. | 257/686 |
| 2001/0002727 | A1 * | 6/2001 | Shiraishi et al. | 257/685 |
| 2001/0011766 | A1 * | 8/2001 | Nishizawa et al. | 257/685 |
| 2002/0072147 | A1 * | 6/2002 | Sayanagi et al. | 438/106 |
| 2002/0125558 | A1 * | 9/2002 | Akram et al. | 257/686 |
| 2004/0188818 | A1 * | 9/2004 | Wang | 257/685 |

FOREIGN PATENT DOCUMENTS

DE  100 11 005 A1  7/1999

OTHER PUBLICATIONS

Xu, et al., "A 3-10-GHz GaN-Based Flip-Chip Integrated Broad-Band Power Amplifier", IEEE Transactions on Microwave Theory and Techniques, vol. 48, No. 12, Dec. 2000, pp. 2573-2578.

Debarbrata Gupta, "A Novel Active Area Bumped Flip Chip Technology for Convergent Heat Transfer from Gallium Arsenide Power Devices", IEEE Transactions on Components, Packaging, and Manufacturing Technology, Part A, vol. 18, No. 1, Mar. 1995, pp. 82-86.

Mamoru Kajihara and Han Park, "A systems approach delivers SiP design", http:/www.eetimes.com/showArticle.jhtml?articleID=26805951, (5 pages), Aug. 9, 2004.

* cited by examiner

Primary Examiner—Evan Pert
Assistant Examiner—Benjamin P. Sandvik
(74) Attorney, Agent, or Firm—Baker Botts L.L.P.

(57) ABSTRACT

An apparatus includes a circuit having first, second and third circuit portions, the first and third circuit portions each including at least one semiconductor circuit component. The second circuit portion includes at least one non-semiconductor circuit component, and is free of semiconductor circuit components. A first substrate has the first and second circuit portions disposed adjacent one side thereof. A second substrate is physically separate from the first substrate, and has the third circuit portion disposed adjacent a side thereof which faces the one side of the first substrate. The second and third circuit portions have electrically conductive parts which are coupled by thermo-formed bonds.

22 Claims, 2 Drawing Sheets

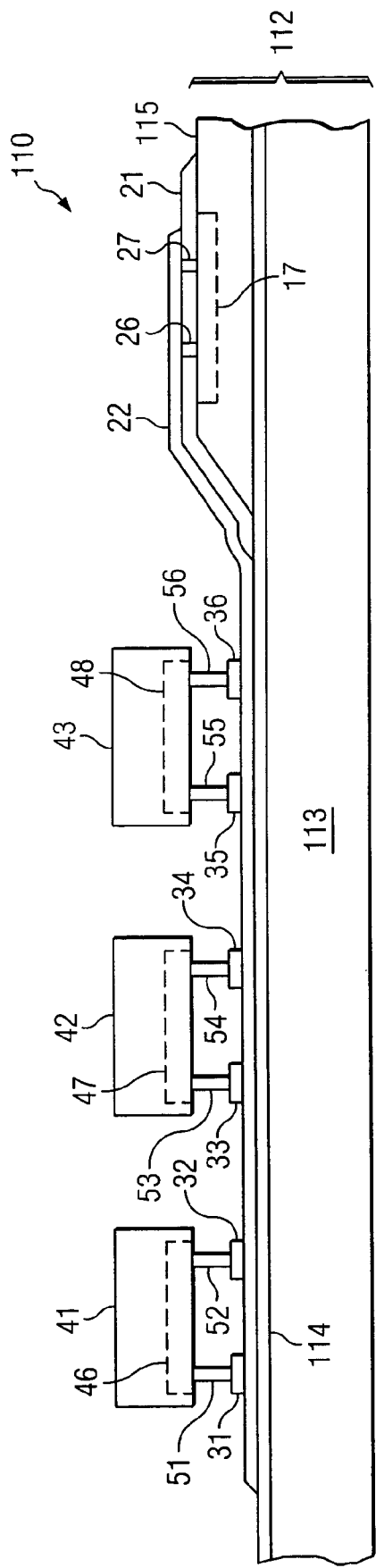
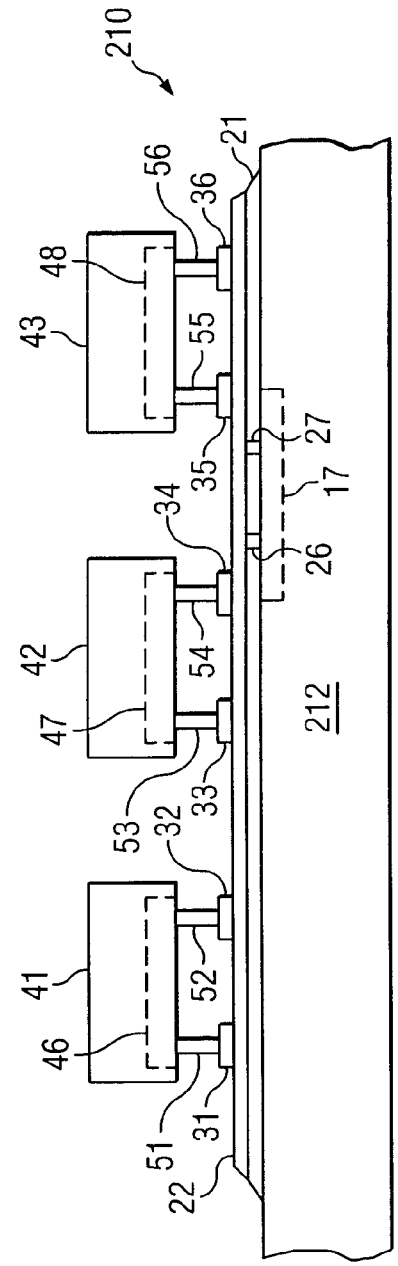
FIG. 3
FIG. 4

METHOD AND APPARATUS FOR COMBINING MULTIPLE INTEGRATED CIRCUITS

TECHNICAL FIELD OF THE INVENTION

This invention relates in general to integrated circuit and, more particularly, to techniques for reducing the cost of making integrated circuits.

BACKGROUND OF THE INVENTION

In microwave systems such as communication systems and phased array antenna systems, microwave circuitry is often implemented in the form of what is commonly known as a microwave monolithic integrated circuit (MMIC). However, a MMIC is a relatively expensive device. For example, the entire MMIC circuit is implemented in a single substrate, which is typically gallium arsenide (GaAs). Gallium arsenide is a relatively expensive material, which costs approximately ten times as much as silicon. Further, since the entire circuit is implemented in a single substrate, and since the circuit typically includes several circuit components such as transistors for which the production yield is less than ideal, the percentage of chips obtained from a single production wafer without any significant defect can be on the order of only about 50% to 60%. Due to the number of defective chips which must be discarded, the effective production cost for the good chips is higher than would be the case if there was a higher production yield from the wafer.

A well-known alternative approach is commonly referred to as a hybrid circuit. In this approach, a portion of the overall circuit is provided on one substrate, such as a relatively expensive gallium arsenide substrate. The other portion of the circuit is provided on a different substrate, which is typically a cheaper material. The two substrates are then electrically coupled by bond wires that extend between bond pads provided on the substrates. While this hybrid approach has been generally acceptable for some applications, it has not been suitable for all applications. For example, in the case of a high frequency circuit, the bond wires exhibit parasitic inductance, and the bond pads exhibit parasitic capacitance. Consequently, there is still a need for a cheaper alternative to MMICs, which is suitable for applications such as high frequency microwave applications.

SUMMARY OF THE INVENTION

According to one form of the invention, an apparatus includes a circuit having first, second and third circuit portions, the first and third circuit portions each including at least one semiconductor circuit component, and the second circuit portion including at least one non-semiconductor circuit component and being free of semiconductor circuit components, the second circuit portion having first and second electrically conductive parts, and the third circuit portion having third and fourth electrically conductive parts which are respectively coupled to the first and second electrically conductive parts by respective thermo-formed bonds. A first substrate has the first and second circuit portions disposed adjacent one side thereof, the first substrate having a semiconductor portion which has each semiconductor circuit component of the first circuit portion therein. A second substrate has the third circuit portion disposed adjacent one side thereof, the second substrate being physically separate from the first substrate and being oriented so that the one side thereof faces the one side of the first substrate, and the second substrate having a semiconductor portion which has each semiconductor circuit component of the third circuit portion therein.

According to another form of the invention, a method includes: providing a first substrate which has a semiconductor portion; forming first and second circuit portions adjacent one side of the first substrate, the first circuit portion including at least one semiconductor circuit component, and the second circuit portion including at least one non-semiconductor circuit component and being free of semiconductor circuit components, the second circuit portion having first and second electrically conductive parts, and the semiconductor portion of the first substrate having therein each semiconductor circuit component of the first circuit portion; providing a second substrate which is physically separate from the first substrate and which has a semiconductor portion; forming a third circuit portion adjacent one side of the second substrate, the third circuit portion including at least one semiconductor circuit component and having third and fourth electrically conductive parts, and the semiconductor portion of the second substrate having therein each semiconductor circuit component of the third circuit portion; orienting the second substrate so that the one side thereof faces the one side of the first substrate and so that the first and second electrically conductive parts are respectively engaging the third and fourth electrically conductive parts; and creating a thermo-formed bond between the first and third electrically conductive parts and a further thermo-formed bond between the second and fourth electrically conductive parts, so that the first, second and third circuit portions serve as respective portions of a single circuit.

BRIEF DESCRIPTION OF THE DRAWINGS

A better understanding of the present invention will be realized from the detailed description which follows, taken in conjunction with the accompanying drawings, in which:

FIG. 3 is a diagram showing a portion of a device which embodies aspects of the present invention and which is an alternative embodiment of the device of FIG. 1; and FIG. 4 is a diagram showing a portion of a device which embodies aspects of the present invention and which is another alternative embodiment of the device of FIG. 1.

DETAILED DESCRIPTION OF THE INVENTION

Figure 1:
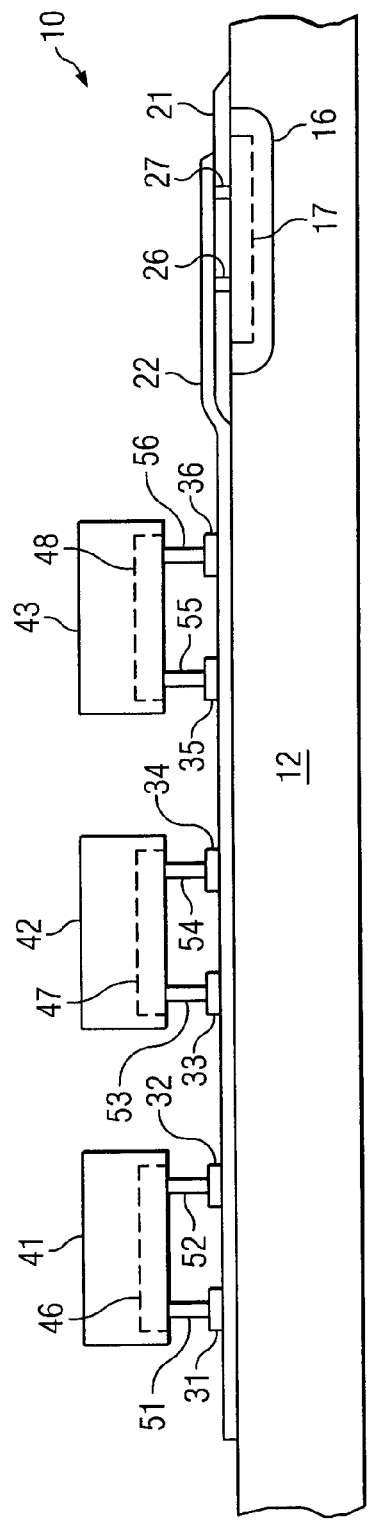
FIG. 1 is a diagram showing a portion of a device which embodies aspects of the present invention.

FIG. 1 is a diagram showing a portion of a device 10, which embodies aspects of the present invention. The device 10 includes a main substrate 12, which is made from silicon, but which could alternatively be made from any other suitable material. A portion 16 of the silicon substrate 12 is doped in a known manner, in order to form a semiconductor portion within the substrate. A circuit portion 17 is indicated diagrammatically by broken lines, and is formed within the semiconductor portion 16 using known semiconductor circuit fabrication techniques. For simplicity, it is assumed for purposes of the present discussion that the circuit portion 17 is a single semiconductor circuit component, such as a diode or a transistor. However, the circuit portion 17 could alternatively include two or more circuit components.

A layer 21 of an electrically insulating material is provided on top of the substrate 12, so as to cover at least part of the semiconductor portion 16. In FIG. 1, the insulating layer 21 is made from silicon dioxide, but it could alternatively be made from any other suitable insulating material.

A further circuit portion 22 is shown diagrammatically, and has one section which is on the insulating layer 21, and a further section which is on the surface of the substrate 12. The semiconductor portion 16 of the substrate 12 has a degree of electric conductivity, and the insulating layer 21 provides electrical insulation between the circuit portion 22 and the semiconductor portion 16. Outside the semiconductor portion 16, the silicon substrate 12 is electrically non-conductive, and thus the circuit portion 22 has a section which is provided directly on the top surface of the substrate 12.

The circuit portion 22 includes one or more non-semiconductor circuit components, sometimes known as passive components, such as resistors, capacitors and/or inductors. The passive components may, for example, form a matching network. The circuit portion 22 is electrically coupled to the circuit portion 17 by two or more vias that extend through the insulating layer 21, two of which are shown at 26 and 27. The circuit portion 22 has a plurality of electrically conductive contacts or pads, six of which are shown diagrammatically at 31-36. In the embodiment of FIG. 1, the contacts 31-36 are each made of gold, but could alternatively be made of some other suitable material.

The device 10 includes three further substrates 41-43, which are each physically separate from the substrate 12, and from each other. The substrates 41-43 are each made from a semiconductor material. In FIG. 1, the substrates 41-43 are each made from the same semiconductor material, which is gallium arsenide (GaAs). However, it would alternatively be possible for some or all of these substrates to be made from respective different semiconductor materials.

Each of the semiconductor substrates 41-43 has a respective circuit portion 46-48 formed therein using known semiconductor circuit fabrication techniques. The circuit portions 46-48 each include one or more semiconductor circuit components. For simplicity in the present discussion, it is assumed that the circuit portions 46-48 are each a single semiconductor circuit component, such as a field effect transistor (FET). However, one or more of the circuit portions 46-48 could alternatively include two or more circuit components.

The substrate 41 has a plurality of electrically conductive parts which are projections or "bumps", two of which are shown diagrammatically at 51 and 52. In the embodiment of FIG. 1, the bumps 51 and 52 are each made of gold, but could alternatively be made of some other suitable material. The bumps 51 and 52 are each physically and electrically coupled at an upper end to the circuit portion 46, and are each physically and electrically coupled at a lower end to a respective one of the pads 31 and 32 of the circuit portion 22. In the embodiment of FIG. 1, the bumps 51 and 52 are ultrasonically bonded to the contacts 31 and 32. Alternatively, however, the bumps and contacts could be coupled to each other through the use of some other suitable technique, such as thermal compression.

In a similar manner, the substrates 42 and 43 each have at least two electrically conductive bumps made of gold, four of which are depicted at 53-56. The bumps 53 and 54 are physically and electrically coupled at their upper ends to the circuit portion 47, and are ultrasonically bonded at their lower ends to the contacts 33 and 34, respectively. The bumps 55 and 56 are physically and electrically coupled at their upper ends to the circuit portion 48, and are ultrasonically bonded at their lower ends to the contacts 35 and 36, respectively. After fabrication, the device 10 can be provided with a not-illustrated coating, in order to give it a quasi-hermetic seal.

As is known in the art, the silicon material of the substrate 12 has a coefficient of thermal expansion (CTE) which is different from the CTE of the gallium arsenide material of the substrate 41-43. However, in the embodiment of FIG. 1, the circuit portions 46-48 each have a sufficiently small number of circuit components so that the substrates 41-43 are relatively small in size. As a result, the differences in CTEs do not present a problem. In other words, the device 10 can be used across a relatively wide temperature range without causing any of the bumps 51-56 to break away from the associated contacts 31-36 as a result of stresses produced by differing CTEs.

In FIG. 1, the five circuit portions 17, 22 and 46-48 collectively form a single overall circuit. As one example, this circuit may be a microwave phase shifter circuit, where the circuit portions 46-48 each include a single radio-frequency transistor, the circuit portion 22 provides associated passive circuitry such as matching networks, and the circuit portion 17 provides some remaining semiconductor circuitry.

Since the circuit portion 22 in FIG. 1 contains only passive circuit components, it necessarily has a relatively high production yield. In addition, the circuitry within the circuit portion 17 is selected and configured so that it has a relatively high production yield. In contrast, the circuit portions 46-48 in the substrates 41-43 are components or groups of components that tend to have a lower production yield. For example, the production yield in percent from a single wafer for the substrate 41 may be less than the production yield in percent from a single wafer for the entire main substrate 12, including both of the circuit portions 17 and 22. Of course, since the circuit portions 46-48 each contain a single circuit component, or only a small number of circuit components, the production yield from a single wafer in percent for each of the substrates 41-43 will still be higher than the production yield from a single wafer in percent for a chip which included all of the circuit portions 46-48 (or even the entire circuit), because a defect in any one of the circuit portions 46-48 within a single chip would make it necessary to discard the entire chip. Thus, by splitting the overall circuit among multiple substrates in a manner which seeks to optimize the production yield for each substrate, the production cost of each substrate is minimized, and thus the production cost for the overall device 10 is lower than would be the case if the entire circuit were implemented in a single substrate.

To the extent that certain circuit components need to be implemented in a substrate material which is relatively expensive, those components are allocated to one or more of the substrates 41-43, which are relatively small, so as to minimize the amount of the expensive substrate material used for the overall device 10. The main substrate 12, which is larger, is made from a less expensive substrate material. This also helps to reduce the production cost of the overall device. For example, where circuitry is allocated among substrates with appropriate attention to both production yields and substrate costs, the cost of the device 10 can be as low as approximately one-fifth the cost of a device such as a MMIC, in which the entire circuit is formed in a single substrate. But even where all of the substrates in the device are made from relatively expensive substrate materials, the considerations discussed above in regard to production yields still provide a significant cost advantage over pre-existing techniques.

Although it has been assumed for purposes of this discussion that the circuit portions 46-48 in FIG. 1 are each implemented using the same semiconductor substrate material and the same semiconductor technology, it would alternatively be possible for some or all of the substrates 41-43 to be different semiconductor materials, and/or for some or all of the circuit portions 46-48 to be implemented using different semiconductor technologies. This permits each of the circuit portions 46-48 to be selected from the best possible semiconductor technology for its particular function. Thus, for example, it would be possible for the circuit portion 46 to be an mHEMT transistor for a first circuit stage, and for the circuit portion 47 to be pHEMT or HBT transistor for a second circuit stage. With this in mind, it will be noted that a variety of different technologies can be integrated into a single device of the type shown at 10, such as one or more of mHEMT, GaN, pHEMT, HBT, VPIN, MEMS, CMOS, Si, Ge, and/or SiGe.

Figure 2:
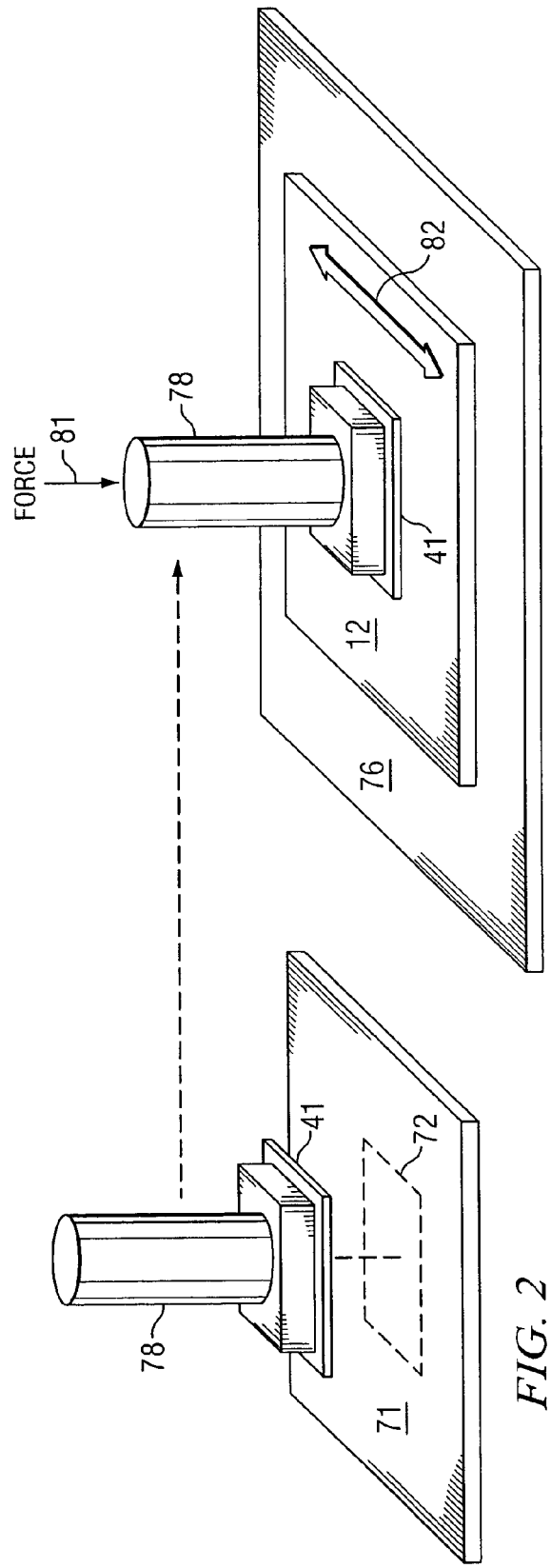
FIG. 2 is a diagrammatic perspective view showing a technique by which two substrates in the embodiment of FIG. 1 can be physically and electrically coupled to each other.

FIG. 2 is a diagrammatic perspective view showing a technique by which the substrate 41 of FIG. 1 can be physically and electrically coupled to the substrate 12. More specifically, after fabrication of the substrate 41, including the circuit portion 46 and the bumps 51-52, the substrate 41 is supported at a location 72 on a support 71 of a known type which is commonly referred to as a "waffle pack". The substrates 42 and 43 are also supported on the waffle pack 71, but for clarity are not shown in FIG. 2. A heated support 76 is provided at a location near the waffle pack 71, and supports the main substrate 12, including the circuit portion 17 and the circuit portion 22 with the contacts 31-36.

A pick-up tool 78 of a known type is manually aligned with the substrate 41 on the waffle pack 71, and then is lowered vertically to a position engaging the substrate 41. The pick-up tool 78 picks up the substrate 41 in a known manner and moves upwardly, so that the substrate 41 is lifted upwardly away from the waffle pack 71. The pick-up tool 78 is then moved laterally until it is disposed over the substrate 12 on the heated support 76.

The pick-up tool 78 then is lowered toward the substrate 12, and is manually positioned in lateral directions so that the bumps 51 and 52 on the substrate 41 are respectively aligned with the contacts 31 and 32 on the substrate 12. Existing tools of the type shown at 78 permit the substrate 41 to be positioned relative to the substrate 12 with an accuracy of approximately ±1 micron. The pick-up tool 78 is then moved downwardly so that the bumps 51-52 on the substrate 41 come into engagement with the respective contacts 31-32 on the substrate 12.

A downward vertical force 81 is then applied to the pick-up tool 78, and ultrasonic energy is applied as indicated diagrammatically at 82. This causes the gold bumps 51-52 to become ultrasonically bonded to the respective contacts 31 and 32. The pick-up tool 78 then releases the substrate 41, and is moved upwardly away from it. Then, in a manner similar to that just described for the substrate 41, the pick-up tool 78 can successively pick up the substrates 42 and 43 from the waffle pack 71, and ultrasonically attach the bumps on each to the corresponding contacts on the substrate 12.

FIG. 3 is a diagram showing a portion of a device 110 which embodies aspects of the present invention, and which is an alternative embodiment of the device 10 of FIG. 1. Equivalent parts are identified with the same reference numerals, and the following discussion is directed primarily to the differences.

The device 110 of FIG. 3 includes a substrate 112, which is a substrate of the type commonly known as a silicon on insulator (SOI) substrate. In particular, there is a base layer 113 with an insulating layer 114 provided on it. In FIG. 3, the insulating material 114 is silicon dioxide, but it would alternatively be possible to use some other suitable insulating material for the layer 114. The substrate 112 also includes a layer 115 of silicon on top of the insulating layer 114. The entire silicon layer 115 is doped in a known manner, so that it is a semiconductor. A portion of the silicon layer 115 has been etched away, in order to expose a portion of the top surface of the insulating layer 114.

The circuit portion 17 is formed in the silicon semiconductor layer 115. The insulating layer 21 is formed over at least part of the circuit portion 17, and extends to the exposed top surface of the insulating layer 114, which is electrically non-conductive The circuit portion 22 has one section which is formed on this exposed top surface of the insulating layer 114, and a further section which is formed on the insulating layer 21. Aside from the differences discussed above, the device 110 of FIG. 3 is similar in structure and operation to the device 10 of FIG. 1, and can be fabricated in a manner similar to that described above in association with FIG. 2.

FIG. 4 is a diagram showing a portion of a device 210 which embodies aspects of the present invention, and which is another alternative embodiment of the device 10 of FIG. 1. Equivalent parts are identified with the same reference numerals, and the following discussion is directed primarily to the differences.

The device 210 includes a substrate 212, the entirety of which is doped in a known manner so as to make it a semiconductor. The circuit portion 17 is formed in the substrate 212. The insulating layer 21 covers a relatively large area on top of the substrate 212, and the circuit portion 22 is provided entirely on the insulating layer 21. Aside from the differences discussed above, the device 210 of FIG. 4 is similar in structure and operation to the device 10 of FIG. 1, and can be fabricated in a manner similar to that described above in association with FIG. 2.

The present invention provides a number of advantages. One such advantage is realized where a main substrate has one circuit portion containing only non-semiconductor circuit components and has a further circuit portion containing semiconductor circuit components, while a separate further substrate includes a further circuit portion containing one or more semiconductor circuit components. Where the circuit portions on the main substrate have a relatively high production yield in comparison to the circuit portion in the further substrate, the overall device can be fabricated more cheaply than would be the case if all of the circuit portions were fabricated in a single substrate.

A further cost advantage is realized if the main substrate is made from a relatively inexpensive material, and any circuit component which needs to be implemented in an expensive substrate material is allocated to the further substrate. Where appropriate attention is given to substrate materials and production yields, the cost of the device can be as low as approximately one-fifth the cost of a device in which the entire circuit is fabricated in a single substrate.

Another related advantage is that the further substrate can be a semiconductor material which is optimum for the circuit portion disposed in that substrate, and the circuit portion can be implemented with a semiconductor technology which is optimum for that circuit portion. Where there are two or more further substrates, various semiconductor materials and semiconductor technologies can be selectively used in order to optimize the circuit portion in each such substrate.

An advantage is realized where the further substrate is coupled to the main substrate in an inverted or flipped orientation, with electrically conductive parts on the main substrate and further substrate electrically coupled by thermally-formed bonds, for example through thermo-sonic or thermo-compression techniques. This avoids the use of long bond wires to connect the two substrates, and the associated parasitic inductances. It also avoids the cost of the bond wires themselves, and the cost of the labor involved in manually attaching the bond wires to bond pads.

Another advantage is realized when the main substrate is a semiconductor substrate, which permits more accurate feature control during lithographic techniques than would be the case for non-semiconductor substrates such as an alumina substrate. The use of a semiconductor substrate thus allows the fabrication of passive circuitry containing better inductors, as well as smaller and lower-cost matching networks.

As to each further substrate which is made from a material that is different from the main substrate, it is advantageous where the circuit portion on the further substrate involves a limited number of circuit components, and possibly only one circuit component. This permits the further substrate to have a size which is sufficiently small so that any difference in the coefficients of thermal expansion of the main and further substrates is negligible.

Although selected embodiments have been illustrated and described in detail, it will be understood that various substitutions and alterations are possible without departing from the spirit and scope of the present invention, as defined by the following claims.

What is claimed is:

1. An apparatus comprising:
a circuit having first, second and third circuit portions, said first circuit portion including at least one semiconductor component and said third circuit portions including at least one semiconductor circuit component, and said second circuit portion including at least one non-semiconductor circuit component and being free of semiconductor circuit components, said second circuit portion having first and second electrically conductive parts, and said third circuit portion having third and fourth electrically conductive parts which are respectively coupled to said first and second electrically conductive parts by a thermosonic bond and a thermo-compression bond such that said first and second electrically conductive parts rigidly support said first circuit component adjacent said third circuit component;
a first substrate with said first and second circuit portions disposed adjacent one side thereof, said first substrate having a semiconductor portion which has each said semiconductor circuit component of said first circuit portion therein;
a second substrate with said third circuit portion disposed adjacent one side thereof, said second substrate being physically separate from said first substrate and being oriented so that said one side thereof faces said one side of said first substrate, and said second substrate having a semiconductor portion which has said at least one semiconductor circuit component of said third circuit portion therein and said second substrate being devoid of any other semiconductor circuit component; and
wherein the second substrate and the second circuit portion have no electrical connection therebetween other than any electrical connection formed between the first and second electrically conductive parts of the second circuit portion and the third and fourth electrically conductive parts of the third circuit portion.

2. An apparatus according to claim 1,
wherein said first circuit portion has one said circuit component thereof which is implemented in a first semiconductor technology; and
wherein said third circuit portion has one said circuit component thereof which is implemented in a second semiconductor technology different from said first semiconductor technology.

3. An apparatus according to claim 1,
wherein said circuit includes a fourth circuit portion which includes at least one semiconductor circuit component, said second circuit portion having fifth and sixth electrically conductive parts, and said fourth circuit portion having seventh and eight electrically conductive parts which are respectively coupled to said fifth and sixth electrically conductive parts by respective thermo-formed bonds; and
including a third substrate with said fourth circuit portion disposed adjacent one side thereof, said third substrate being physically separate from said first and second substrates and being oriented so that said one side thereof faces said one side of said first substrate, and said third substrate having a semiconductor portion which has each said semiconductor circuit component of said fourth circuit portion therein.

4. An apparatus according to claim 3,
wherein said third circuit portion has one said circuit component thereof which is implemented in a first semiconductor technology; and
wherein said fourth circuit portion has one said circuit component thereof which is implemented in a second semiconductor technology different from said first semiconductor technology.

5. An apparatus according to claim 4, wherein said first circuit portion has one said circuit component thereof which is implemented in a third semiconductor technology different from each of said first and second semiconductor technologies.

6. An apparatus according to claim 1,
wherein said first and second electrically conductive parts are each a contact; and
wherein said third and fourth electrically conductive parts are each a bump.

7. An apparatus according to claim 1, wherein each of said electrically conductive parts is made of gold.

8. An apparatus according to claim 1, wherein said third circuit portion has one said circuit component thereof with a fabrication yield which is lower than a fabrication yield of each said circuit component of said first circuit portion.

9. An apparatus according to claim 1, wherein said third circuit portion has therein a single said circuit component.

10. An apparatus according to claim 9, wherein said single circuit component of said third circuit portion is a transistor.

11. An apparatus according to claim 1, wherein said first substrate is a semiconductor substrate.

12. An apparatus according to claim 1,
wherein said first substrate includes one of silicon and gallium arsenide; and
wherein said second substrate includes gallium arsenide.

13. An apparatus according to claim 1, wherein said circuit is a microwave circuit.

14. A method comprising:
providing a first substrate which has a semiconductor portion;
forming first and second circuit portions adjacent one side of said first substrate, said first circuit portion including at least one semiconductor circuit component, and said second circuit portion including at least one non-semiconductor circuit component and being free of semiconductor circuit components, said second circuit portion having first and second electrically conductive parts, and said semiconductor portion of said first substrate having therein each said semiconductor circuit component of said first circuit portion;
providing a second substrate which is physically separate from said first substrate and which has a semiconductor portion;
forming a third circuit portion adjacent one side of said second substrate, said third circuit portion including at least one semiconductor circuit component, said third circuit portion having third and fourth electrically conductive parts, and said semiconductor portion of said second substrate having therein each said semiconductor circuit component of said third circuit portion;
orienting said second substrate relative to said first substrate so that said one side thereof faces said one side of said first substrate and said first and second electrically conductive parts are respectively engaging said third and fourth electrically conductive parts, said first and second electrically conductive parts rigidly supporting said first circuit component adjacent said third circuit component;
creating a thermosonic bond and a thermocompression bond between said first and third electrically conductive parts and a thermosonic bond and a thermocompression bond between said second and fourth electrically conductive parts, said first, second and third circuit portions being respective portions of a single circuit;
wherein said second substrate is devoid of any semiconductor circuit component other than said at least one semiconductor circuit component of said third circuit portion; and
wherein the second substrate and the second circuit portion have no electrical connection there between other than any electrical connection found between the first and second electrically conductive parts of the second circuit portion and the third and fourth electrically conductive parts of the third circuit portion.

15. A method according to claim 14,
wherein said forming of said first circuit portion includes implementing one said circuit component thereof in a first semiconductor technology; and
wherein said forming of said third circuit portion includes implementing one said circuit component thereof in a second semiconductor technology different from said first semiconductor technology.

16. A method according to claim 14,
wherein said forming of said second circuit portion includes forming fifth and sixth electrically conductive parts;
including providing a third substrate which is physically separate from said first and second substrates and which has a semiconductor portion;
including forming a fourth circuit portion adjacent one side of said third substrate, said fourth circuit portion having at least one semiconductor circuit component and having seventh and eighth electrically conductive parts, and said semiconductor portion of said third substrate having therein each said semiconductor circuit component of said fourth circuit portion;
including orienting said third substrate relative to said first substrate so that said one side thereof faces said one side of said first substrate and said fifth and sixth electrically conductive parts are respectively engaging said seventh and eighth electrically conductive parts; and
creating a thermo-formed bond between said fifth and seventh electrically conductive parts and a further thermo-formed bond between said sixth and eighth electrically conductive parts, said fourth circuit portion being a portion of said single circuit.

17. A method according to claim 16,
wherein said forming of said third circuit portion includes implementing one said circuit component thereof in a first semiconductor technology; and
wherein said forming of said fourth circuit portion includes implementing one said circuit component thereof in a second semiconductor technology different from said first semiconductor technology.

18. A method according to claim 17, wherein said forming of said first circuit portion includes implementing one said circuit component thereof in a third semiconductor technology different from each of said first and second semiconductor technologies.

19. A method according to claim 14, including configuring said third circuit portion so that one said circuit component thereof has a fabrication yield which is lower than a fabrication yield of each said circuit component of said first circuit portion.

20. A method according to claim 19, including configuring said third circuit portion to have a single said circuit component which is a transistor.

21. A method according to claim 14, wherein said providing of said first substrate includes selecting a semiconductor substrate to serve as said first substrate.

22. A method according to claim 14,
wherein said providing of said first substrate includes selecting as said first substrate a material which includes one of silicon and gallium arsenide; and
wherein said providing of said second substrate includes selecting as said second substrate a material which includes gallium arsenide.

* * * * *